United States Patent
Hsu (10) Patent No.: US 7,106,120 B1
(45) Date of Patent: *Sep. 12, 2006

(54) PCMO RESISTOR TRIMMER

(75) Inventor: Sheng Teng Hsu, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 260 days.

This patent is subject to a terminal disclaimer.

(21) Appl. No.: 10/625,647

(22) Filed: Jul. 22, 2003

(51) Int. Cl.
*H03L 5/00* (2006.01)

(52) U.S. Cl. .................... 327/308; 327/334

(58) Field of Classification Search .......... 327/308, 327/334, 494, 587, 588
See application file for complete search history.

(56) References Cited

U.S. PATENT DOCUMENTS

| | | | |
|---|---|---|---|
| 3,271,591 A | 9/1966 | Ovshinsky | 327/500 |
| 3,530,441 A | 9/1970 | Ovshinsky | 365/113 |
| 3,886,577 A | 5/1975 | Buckley | 157/3 |
| 3,921,105 A * | 11/1975 | Brgelz | 327/308 |
| 3,947,801 A | 3/1976 | Bube | 338/308 |
| 3,983,421 A * | 9/1976 | Yogore | 327/308 |
| 4,146,673 A | 3/1979 | Headley | 428/335 |
| 4,412,241 A | 10/1983 | Nelson | 257/525 |
| 4,606,781 A | 8/1986 | Vyne | 438/10 |
| 4,707,909 A | 11/1987 | Blanchard | 438/10 |
| 4,717,886 A | 1/1988 | Davis et al. | 330/252 |
| 4,870,472 A | 9/1989 | Vyne | 338/92 |
| 5,081,439 A | 1/1992 | Natzle et al. | 338/195 |
| 5,166,758 A | 11/1992 | Ovshinsky et al. | 257/3 |
| 5,177,567 A | 1/1993 | Klersy et al. | 257/4 |
| 5,296,716 A | 3/1994 | Ovshinsky et al. | 257/3 |
| 5,335,219 A | 8/1994 | Ovshinsky et al. | 365/288 |
| 5,341,328 A | 8/1994 | Ovshinsky et al. | 365/163 |
| 5,359,205 A | 10/1994 | Ovshinsky | 257/3 |
| 5,406,509 A | 4/1995 | Ovshinsky et al. | 365/113 |
| 5,466,484 A | 11/1995 | Spraggins et al. | 437/228 |
| 5,534,711 A | 7/1996 | Ovshinsky et al. | 257/3 |
| 5,536,947 A | 7/1996 | Klersy et al. | 257/3 |
| 5,541,869 A | 7/1996 | Rose et al. | 365/100 |
| 5,596,522 A | 1/1997 | Ovshinsky et al. | 365/113 |
| 5,635,893 A | 6/1997 | Spraggins et al. | 338/48 |
| 5,687,112 A | 11/1997 | Ovshinsky | 365/163 |
| 5,909,132 A * | 6/1999 | Trofimenkoff et al. | 327/101 |

(Continued)

OTHER PUBLICATIONS

S.Q. Liu, N.J. Wu, A. Ignatiev, "*A new concept for non-volatile memory: the Electric-Pulse Induced Resistive change effect in colossal magnetoresistive thin film*", Proceedings of Non-Volatile Memory Technology Symposium 2001, San Diego, California, Nov. 2001, p. 18-24.

*Primary Examiner*—Long Nguyen
(74) *Attorney, Agent, or Firm*—Robert D. Varitz, PC (57) ABSTRACT

Using programmable resistance material for a matching resistor, a resistor trimming circuit is designed to reversibly trim a matching resistor to match a reference resistor. The programmable resistance materials such as metal-amorphous silicon metal materials, phase change materials or perovskite materials are typically used in resistive memory devices and have the ability to change the resistance reversibly and repeatably with applied electrical pulses. The present invention reversible resistor trimming circuit comprises a resistance bridge network of a matching resistor and a reference resistor to provide inputs to a comparator circuit for generating a comparing signal indicative of the resistance difference. This comparing signal can be used to control a feedback circuit to provide appropriate electrical pulses to the matching resistor to modify the resistance of the matching resistor to match that of the reference resistor.

20 Claims, 5 Drawing Sheets

U.S. PATENT DOCUMENTS

| | | |
|---|---|---|
| 5,912,839 A | 6/1999 | Ovshinsky et al. .... 365/185.03 |
| 6,043,687 A | 3/2000 | Callahan, Jr. ................. 327/73 |
| 6,169,393 B1 | 1/2001 | Hashimoto ................. 323/354 |
| 6,204,139 B1 | 3/2001 | Liu et al. ..................... 438/385 |
| 6,275,090 B1 | 8/2001 | Burger, Jr. et al. ......... 327/334 |
| 6,473,332 B1 | 10/2002 | Ignatiev et al. ............. 365/148 |
| 6,504,417 B1 | 1/2003 | Cecchi et al. ............... 327/308 |
| 6,531,371 B1 | 3/2003 | Hsu et al. .................... 438/385 |
| 6,703,885 B1 * | 3/2004 | Fan et al. .................... 327/308 |
| 2003/0001178 A1 | 1/2003 | Hsu et al. .................... 257/296 |

* cited by examiner

PCMO RESISTOR TRIMMER

FIELD OF THE INVENTION

This invention relates in general to a circuit for resistor trimming, and more particularly, to a circuit for reversible precision adjustment or matching of thin film programmable resistors.

BACKGROUND OF THE INVENTION

Resistors play an important role in microelectronic circuits. A resistor is an electrical component designed to have an electrical resistance independent of the applied current or voltage. Two important issues in the fabrication of resistors in microelectronic processing are the accuracy of the individual resistor and the accuracy of the ratio of a pair of resistors.

Many microeletronic circuits, such as precision analog amplifiers, require the individual resistors to have a specific value to achieve the desired circuit performance level. Other circuits, such as differential amplifiers and analog-to-digital (ADC) or digital-to-analog (DAC) converter applications, require the accurate matching of two resistors, but do not require specific values for the resistors. "Matching resistors" means that the resistors have the same resistance value but may not be of any specific value due to manufacturing variations.

Because process variations affect matched pairs of resistors equally, high accuracy in matching resistors is easier to obtain in microelectronic fabrication processes than in setting individual resistor with a certain resistance value. But for some circuits, this degree of precision is still not adequate. For example, a resistance variation of merely 0.025 percent may compromise the linearity and accuracy of a 12-bit analog-to-digital converter. Thus maintaining the resistor-matching characteristics required for accurate performance is of paramount important in certain precision analog circuits.

Resistor trimming is the most common method used to adjust or match the resistors in these circuits. The term "resistor trimming" means the fine adjustment of the resistance of a resistor in a circuit, either to reach a particular resistance or to match a reference resistor. The resistors could be trimmed by various mechanical, electrical, or chemical methods. For example, a resistor can be trimmed by laser shaping, fuse blowing, or by changing the conductivity of the resistor by activation of impurity doping.

In these prior art resistor trimming methods, the trimming action can be extremely difficult to reverse. The adjustment of the resistance in these methods mostly can only occur in one direction. For example, by laser trimming, the resistance can only increase due to the shaping or the shaving of the resistance material. By activation of impurity doping such as metal migration, the resistance can only decrease due to the migration of the impurities into the resistance material.

Over the years, new resistor and conductor materials have been developed. Specifically, materials used in resistive memory cells have programmable resistance and exhibit reversible resistance change based on external influences. For example, materials having electric pulse-induced-resistive-change (EPIR) effect used in multi-bit non-volatile memory devices can exhibit reversible and repeatable resistance changes under the influence of electrical pulses. The EPIR effect can be found in thin film colossal magnetoresistive (CMR) materials such as $Pr_{0.7}Ca_{0.3}MnO_3$ (PCMO). For detail of the EPIR effect, see S. Q. Liu, N. J. Wu, A. Ignatiev, "*A new concept for non-volatile memory: the Electric-Pulse Induced Resistive change effect in colossal magnetoresistive thin film*", Proceedings of Non-Volatile Memory Technology Symposium 2001, San Diego, Calif., November 2001, p. 18–24. Other examples of a semiconductor resistive memory device are the metal-amorphous silicon-metal (MSM) electrical memory switch disclosed in U.S. Pat. No. 5,541,869 of Rose et al., and the electrical phase change materials such as TeGeSb, disclosed in U.S. Pat. No. 5,912,839 of Ovshinsky et al.

Thus it is advantageous to employ programmable resistance materials developed for resistive memory cells in resistor trimmer circuits for the advantage of reversibly trimmable resistance.

SUMMARY OF THE INVENTION

The present invention discloses a reversible resistor trimming circuit to match resistances with the use of programmable resistance material. By using the materials that allow the resistance to be programmed reversibly, the present invention allows the adjustment of a matching resistor to match a reference resistor in both increasing and decreasing resistance values.

In the first embodiment, the present invention reversible resistor trimming circuit comprises a resistor bridge network comprising a matching resistor and a reference resistor, a comparator and a pulse feedback circuit. The reversible resistor trimming circuit first compares the matching resistor to the reference resistor through the comparator circuit. Then the comparator circuit generates a comparing signal indicative of the difference. This signal then controls the polarity, the amplitude or the duration of an electrical pulse provided by the pulse feedback circuit to adjust the resistance of the matching resistor. The process is repeated until the resistances of the matching resistor and the reference resistor are matched. By using a matching resistor made of programmable resistance materials, the present invention provides resistor trimming in both directions, thus allowing the adjustment of resistance over-trimming.

The programmable resistance material disclosed in the present invention is often employed in resistive memory device such as metal-amorphous silicon-metal (MSM) materials, phase change materials, or perovskite materials exhibiting colossal magnetoresistive effect or high temperature superconducting effect. The metal-amorphous silicon-metal (MSM) material comprises boron doped amorphous silicon located between two metal electrodes. The phase change materials employed in resistive memory devices comprises at least one chalcogen and may include one or more transition metals. The perovskite materials exhibiting colossal magnetoresistive effect or high temperature superconducting effect employed in resistive memory devices are manganite materials such as PCMO.

Depending on the programmable resistance materials used, the feedback circuit of the reversible resistor trimming circuit can provide the resistance adjustment pulses having the polarity, amplitude or duration directly related to the comparing signal. The pulse amplitude, the pulse duration and the number of pulses can also be controlled to improve the resistance overshoot.

In another embodiment of the present invention, the reversible resistor trimming circuit further comprises a transmission gate between a resistor bridge network and a comparator circuit to isolate the resistor bridge network, and a delay circuit to improve the timing of a feedback circuit.

DETAILED DESCRIPTION OF THE INVENTION

The present invention discloses a novel circuit to reversibly trim the resistor to match a reference resistor in electronics circuits by the use of programmable resistance material.

In prior art resistance trimmer circuits, the act of resistor trimming often cannot be reversed due to the irreversibility of the resistance material or the trimming process. The prior art resistance material or the trimming process usually only allows the resistance value to either increase or decrease, but not both.

For example, by laser trimming, the resistance can only increase due to the shaving or the shaping of the resistive material. Therefore the resistor material is designed with a very low initial resistance value, and then is trimmed to the appropriate resistance. If the resistor is trimmed excessively, the circuit cannot be repaired because the resistor cannot be reversed to the previous lower value. Similarly, the resistor trimming process is irreversible in fuse blowing or in zener diode zapping.

Another prior art method for resistor trimming is to change the resistance of the materials by impurity diffusion, such as n-type (e.g. phosphorous) doped or p-type (e.g. boron) doped or metal (e.g. aluminum) doped silicon. The initial resistance of the silicon film is normally high, and can then be decreasingly adjusted (or trimmed) by diffusing the impurity into the silicon. Again, the resistance can only decrease due to the migration of the impurity into the resistor, and the trimming action cannot be reversed.

Recent developments of RRAM (resistive random access memory) circuit have introduced a class of materials (programmable resistance material) that have electrical resistance characteristics that can be changed by external influences. From an electrical point of view, this class of programmable resistance materials can be modeled as a programmable variable resistor. The variable resistor can be programmed to have high resistance or low resistance, or any intermediate resistance values. The different resistance values of the variable resistor represent the information stored in the RRAM circuit.

The present invention employs this class of materials in a reversible resistor trimming circuit. By using the materials that allow the resistance to be programmed reversibly, the present invention allows the adjustment of a matching resistor to match a reference resistor in both increasing and decreasing resistance value.

In the first embodiment, the present invention reversible resistor trimming circuit comprises a resistor network comprising a matching resistor and a reference resistor, a comparator and a pulse feedback circuit. The reversible resistor trimming circuit first compares the matching resistor value to the reference resistor value through the comparator circuit;

then the comparator circuit generates a comparing signal output indicative of the difference between the reference resistor value and the matching resistor value;

then the output comparing signal controls either the polarity, the amplitude or the duration or any combinations of an electrical pulse generated by the pulse feedback circuit.

The process is repeated until the resistance value of the matching resistor and the reference resistor are equal.

The electrical pulses generated by the pulse feedback circuit are controlled by a comparing signal and applied to the matching resistor to adjust the resistance value of the matching resistor toward the resistance value of the reference resistor. By using a matching resistor made of programmable resistance materials, the present invention provides resistor trimming in both directions, thus allowing the adjustment of resistance over-trimming. Since the reversible resistor trimming circuit is a feedback circuit, the resistance variation can be linear or non linear. In addition, the reversible resistor trimming circuit can be employed to calibrate the matching resistances at any time to ensure resistances matching against time or temperature drift.

The resistor network comprises a matching resistor fabricated using a programmable resistance material, and a reference resistor. The resistance value of the matching resistor initially can be higher or lower than the resistance value of the reference resistor, and ultimately will be trimmed to match the resistance value of the reference resistor. The resistor network is preferably a bridge network that comprises a four resistor bridge, including two other equal resistors.

The resistor bridge serves as input to a comparator circuit which compares the resistance value of the matching resistor and the reference resistor and produces a comparing signal output indicative of the difference. The comparator circuit is preferably a differential amplifier, comprising an operational amplifier. The sensitivity of the comparator circuit controls the precision of the resistor trimming circuit. A highly sensitive comparator circuit can provide more precision resistor matching due to the sensitivity of the comparing signal. The output of the comparator circuit (meaning the comparing signal) is fed into the pulse feedback circuit which produces an electrical pulse to the resistor bridge to adjust the resistance of the matching resistor to reduce the difference in the resistances as shown by the comparing signal. The pulse feedback circuit is designed to provide the appropriate pulses (e.g. pulse polarity, pulse amplitude, pulse duration, number of pulses) to induce the appropriate resistance change in the matching resistor. For example, the pulse feedback circuit provides the pulses with the correct polarity for reversing resistance change for materials where the direction of the resistance change depends on the polarity of the induced pulses; and provides the pulses with the correct amplitude for materials where the direction of the resistance change depends on the amplitude of the induced pulses. The pulse feedback circuit is preferably a programmable pulse generator, controlled by the comparing signal.

The material of the matching resistor used in the present invention reversible resistor trimming circuit is a programmable resistance material, meaning the resistance of the material can be reversibly adjusted with the application of an electrical signal, preferably a pulsed signal. The resistance of these materials is then a function of the number of pulses, the polarity, the amplitude or the duration of the applied electrical pulses. The programmable resistance materials disclosed in the present invention are often employed in resistive memory devices. The examples of such materials are metal-amorphous silicon-metal (MSM) materials, phase change materials, and perovskite materials exhibiting colossal magnetoresistive effect or high temperature superconducting effect.

The metal-amorphous silicon-metal (MSM) material comprises a resistive layer such as boron doped amorphous silicon located between two electrodes, one electrode is Cr and the other is V, Co, Ni, Pd, Fe or Mn (see U.S. Pat. No. 5,541,869 of Rose et al., hereby incorporated by reference). The variable resistance characteristic of the metal-amorphous silicon-metal composite comes from the diffusion of the metal electrodes into the amorphous silicon. The direction of the resistance changes in this programmable resistance material depends on the polarity of the applied pulses. One polarity causes a decrease in the value of the resistance, and the opposite polarity causes an increase in the value of the resistance. The resistance of this programmable resistance material can be adjusted to a target value by varying the voltage pulse duration instead of varying the magnitude. Thus, the resistance value of a matching resistor can be adjusted to a reference resistance value by the pulse feedback circuit, which selects a suitable polarity and/or voltage amplitude based on the comparing signal and then applies a pulse of an appropriate duration. If the process overshoots, the comparing signal will respond appropriately, and thus will control the pulse feedback circuit to reverse the polarity of the applied pulse. In addition, smaller pulse duration can be used to further reduce overshoot amounts.

Another kind of programmable resistance material employed in resistive memory devices is a chalcogenide material. Chalcogenide alloys can exhibit two different stable reversible structural states, namely an amorphous state having a high electrical resistance and a polycrystalline state having a lower electrical resistance. Since the binary information is represented by two different phases of the material, it is inherently non-volatile and requires no energy to keep the material in either of its two stable structural states. Resistive heating by an electrical current can be used to change the phase of the chalcogenide materials. Therefore information can be stored (or written) to a chalcogenide material by applying a current pulse to the chalcogenide material. A short pulse of high electrical current will give rise to a high temperature above the melting temperature to form the amorphous state, and a long pulse of lower electrical current will crystallize the material at a lower temperature to form the polycrystalline state. The information can then be sensed (or read) by sensing the voltage across the chalcogenide material using a constant current source, or by sensing the current through the chalcogenide material using a constant voltage source.

In the chalcogenide material disclosed by Buckley et al. in U.S. Pat. No. 3,886,577, the resistor can be set to a low resistance value after an electrical pulse of sufficiently high voltage and of sufficiently long duration is applied, and afterwards, if a high current and shorter duration electrical pulse is applied, the resistor may be set to a high resistance value.

Examples of phase change materials employed in resistive memory devices were provided by Ovshinky et al., in U.S. Pat. Nos. 3,271,591; 3,530,441; 5,166,758; 5,296,716; 5,335,219; 5,534,711; 5,536,947; 5,596,522; 5,687,112 and 5,912,839, the disclosures of which are incorporated by reference herein. The disclosed phase change materials include at least one chalcogen and may include one or more transition metals. The term "chalcogen" refers to the elements in group VI of the periodic table. Chalcogenide alloys contain at least one of these elements such as the alloys of germanium, antimony, or tellurium. The term "transition metal" refers to the elements with the atomic number 21–30, 39–48, 57 and 72–80, such as Cr, Fe, Ni, Nb, Pd, and Pt. An example of a phase change material is a Te—Ge—Sb ternary system with the average concentration of Te from about 48% to about 58%, average concentrations of Ge from about 8% to about 40%, and the remainder Sb. The resistance of this phase change material is a function of the applied pulse voltages, reversibly and repeatably. Typically the applied voltage pulses have a pulse width that are between 25 ns to 250 ns.

The resistance of this programmable resistance material can be adjusted to a target value by varying the voltage pulse amplitude. Thus, the resistance of a matching resistor can be adjusted by the selection of suitable voltage amplitude.

Examples of perovskite materials exhibiting colossal magnetoresistive effect or high temperature superconducting effect employed in resistive memory devices were provided in U.S. Pat. No. 6,204,139 of Liu et al., and U.S. Pat. No. 6,473,332 of Ignatiev et al., hereby incorporated by reference. The disclosed perovskite materials useful in the memory devices are characterized by a programmable resistance through the application of electrical pulses and an increase or decrease in the resistance value of the material depending on the polarity of the applied electrical pulses. The rate of resistance change depends on the following parameters: the pulse amplitude, the pulse waveform, the pulse duration and the history of the change of the resistance. Thus, similar to the metal-amorphous silicon-metal materials, the resistance value of a matching resistor employing these programmable resistance materials can be adjusted by the selection of suitable polarity and/or voltage amplitude.

Figure 1:
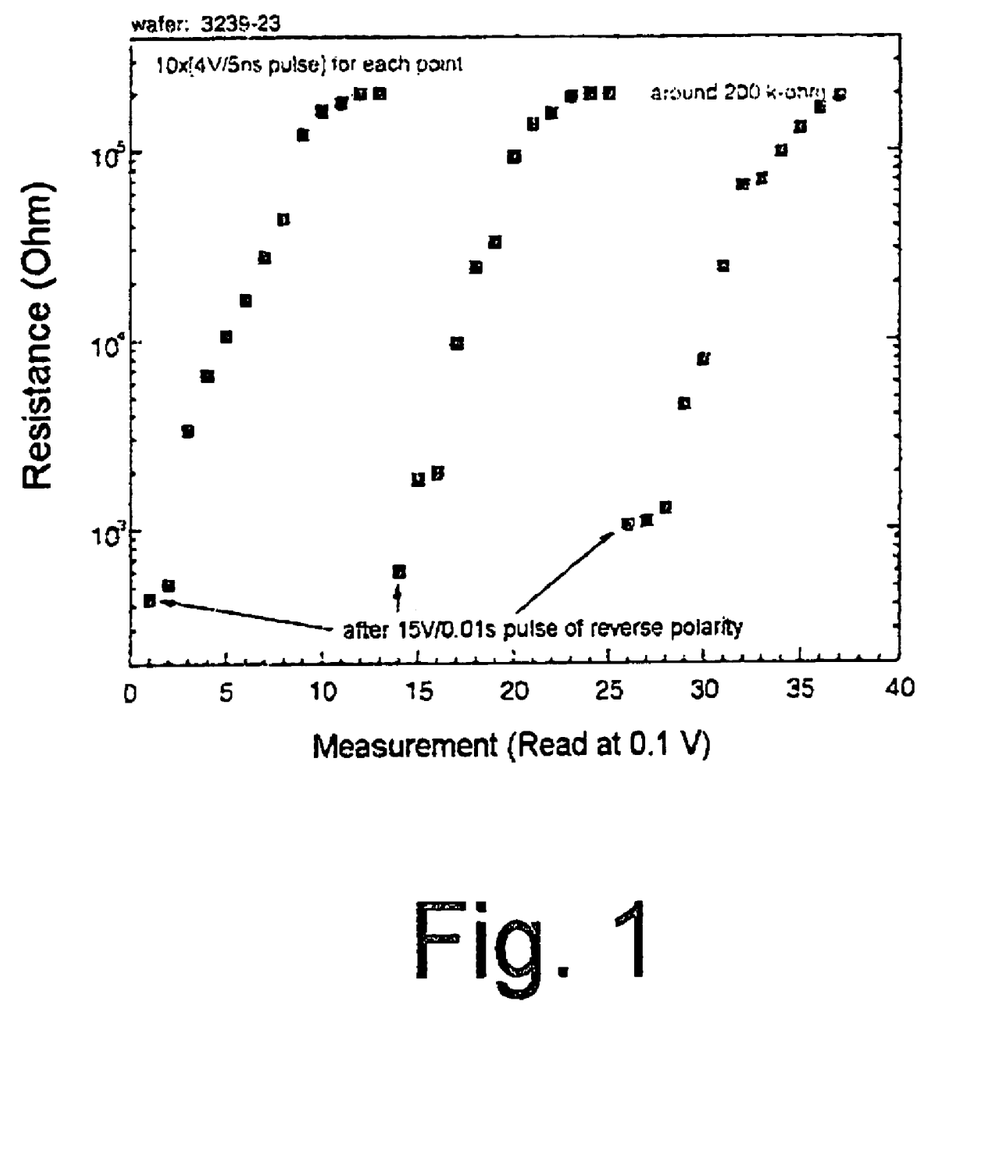
FIG. 1 shows the resistance function of a PCMO material.

$Pr_{0.7}Ca_{0.3}MnO_3$ (PCMO) is a typical perovskite material that can be used in a matching resistor for the present invention reversible resistor trimming circuit. FIG. 1 shows the resistance of a thin film PCMO material as a function of the number of applied voltage pulses. This figure shows that the resistance of a PCMO material can be reversibly adjusted to any value within certain resistance limits, from 400Ω to about 200 kΩ in this sample. The resistance limits can be modified and the resistor fabricated based on the thin film properties such as thickness and microstructure. Each point in the resistance curves of FIG. 1 consists of 10 pulses of 4 V, 5 ns voltage pulses in the direction of increasing resistance. As shown in FIG. 1, the PCMO resistance increases steadily with the number of applied pulses. The voltage pulse applied to the PCMO thin film resistor is preferably ranging from 1 fs to 1 s, and more preferably from 1 ns to 1 μs, and preferably ranging from 100 mV to 100V, and more preferably from 100 mV to 20V. When the polarity of the voltage pulse is reversed, the resistance value of the resistor decreases. The resistance value of the PCMO thin film sample drops from a high resistance of 200 kΩ to a lower value of 400Ω after the application of a 15 V, 0.01 s voltage pulse with a reverse polarity. Usually for PCMO materials, a negative pulse decreases the resistance. The rate of resistance change depends on the pulse width and pulse amplitude. Thus for a pulse with very narrow pulse width or very small pulse amplitude, the resistance change by each pulse is very small. A negative pulse of 15 V, 0.01 s reduces the resistance from 200 kΩ to 400Ω while 10 positive pulses of 4 V, 5 ns only increase the resistance by about 4 kΩ to 6 kΩ.

Figure 2:
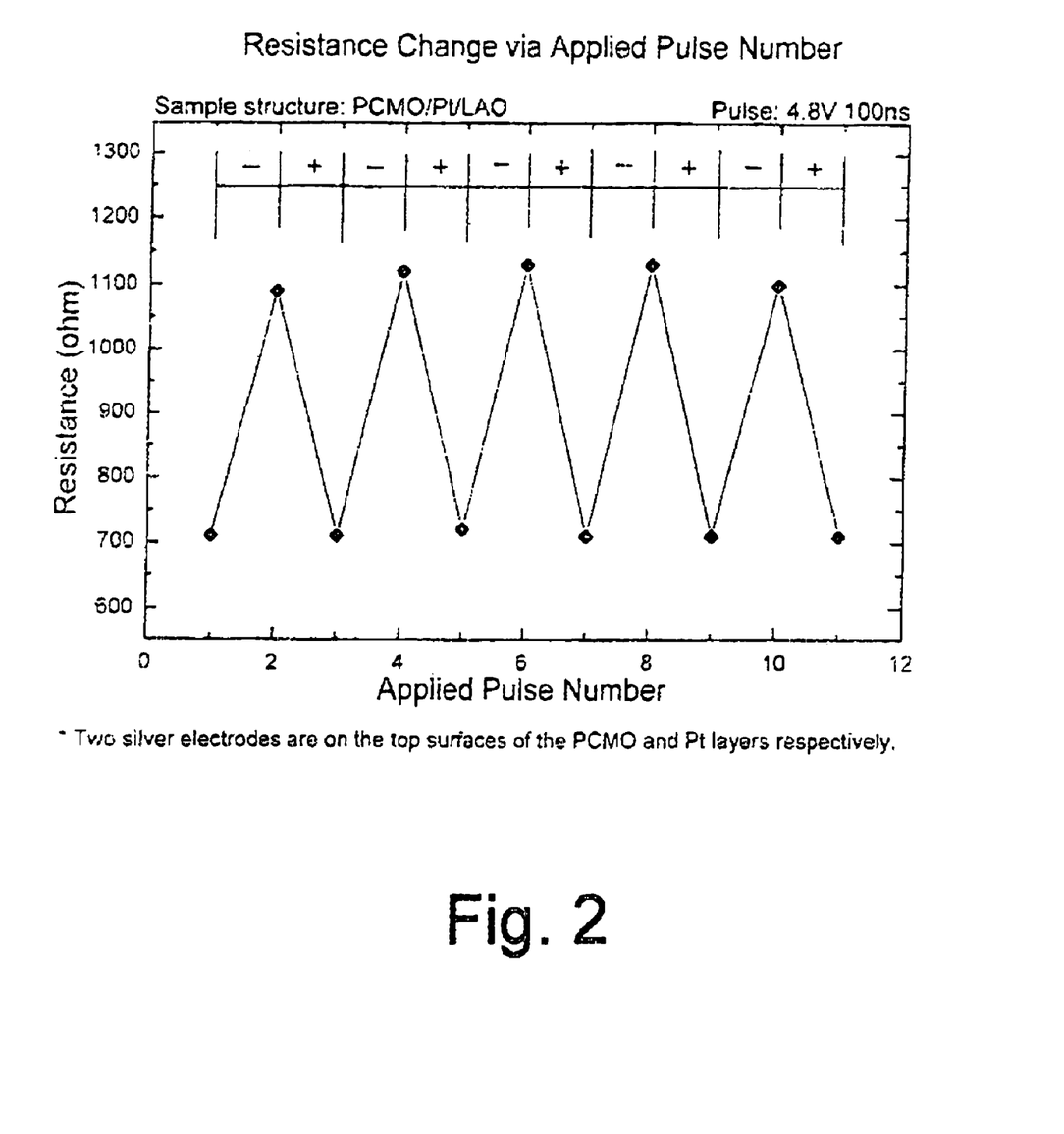
FIG. 2 shows the reversibility of the resistance of a PCMO material.

FIG. 2 shows the reversibility of the PCMO material. A series of alternate polarity pulses of 4.8 V, 100 ns is applied to the PCMO thin film, and drives the PCMO resistance repeatably from a low resistance of 700Ω to a higher resistance of 1100Ω and back.

The PCMO thin film resistor used in FIGS. 1 and 2 was deposited on Pt on a LaAlO$_3$ (LAO) substrate. Alternately, the PCMO thin film can be deposited on a YBa$_2$Cu$_3$O$_7$ (YBCO) layer. Two silver electrodes are deposited on the top surfaces of the PCMO and the Pt respectively. Alternately, the electrode contacts may be made of Ag, Au, Pt or other metal or a conducting oxide.

PCMO belongs to a class of materials having perovskite structure such as colossal magnetoresistive (CMR) materials, or high temperature superconductivity (HTSC) materials that can have their resistance values changed by an external electric field, and thus can be used in the present invention as the programmable resistance material. HTSC materials such as PbZr$_x$Ti$_{1-x}$O$_3$, YBCO (Yttrium Barium Copper Oxide, YBa$_2$Cu$_3$O$_7$ and its variants), have their main use as a superconductor, but since their conductivity can be affected by an electrical current or a magnetic field, these HTSC materials can also be used as matching resistors in the present invention.

Typical perovskite materials having CMR effect are the manganite perovskite materials of the Re$_{1-x}$Ae$_x$MnO$_3$ structure (Re: rare earth elements, Ae: alkaline earth elements) such as Pr$_{0.7}$Ca$_{0.3}$MnO$_3$ (PCMO), La$_{0.7}$Ca$_{0.3}$MnO$_3$ (LCMO), Nd$_{0.7}$Sr$_{0.3}$MnO$_3$ (NSMO). The rare earth elements are La, Ce, Pr, Nd, Pm, Sm, Eu, Gd, Tb, Dy, Ho, Er, Tm, Yb, and Lu. The alkaline earth metals are Be, Mg, Ca, Sr, Ba, and Ra.

Suitable programmable resistance materials for the present invention include CMR materials and HTSC materials such as PrCaMnO (PCMO), LaCaMnO (LCMO), LaSrMnO (LSMO), LaBaMnO (LBMO), LaPbMnO (LPMO), NdCaMnO (NCMO), NdSrMnO (NSMO), NdPbMnO (NPMO), LaPrCaMnO (LPCMO), and GdBaCoO (GBCO).

Figure 3:
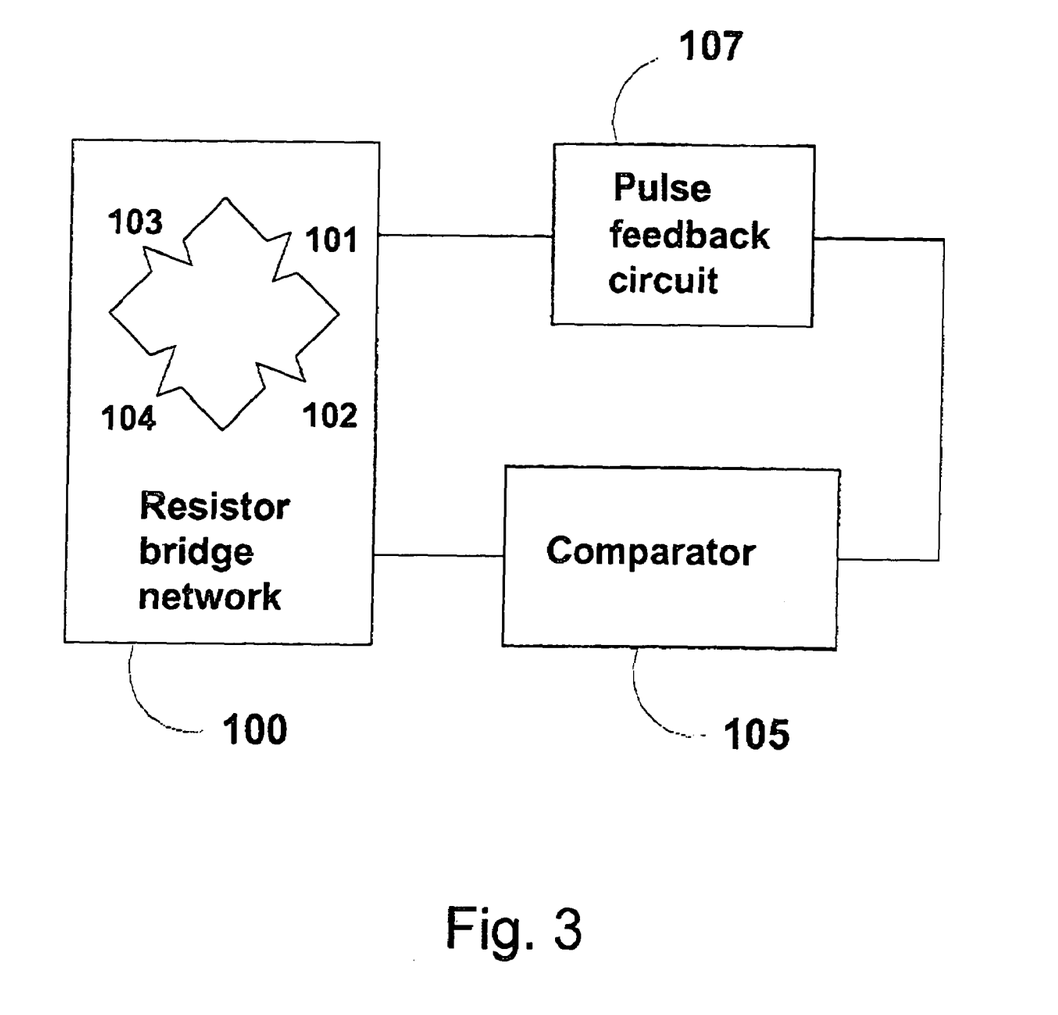
FIG. 3 shows the first embodiment of the present invention reversible resistor trimming circuit.

Using programmable resistance materials as described above, the present invention discloses a novel circuit to reversibly trim a resistor to match a reference resistor in an electronic circuit. FIG. 3 shows the first embodiment of the present invention reversible resistor trimming circuit. A resistor bridge network 100 comprising a matching resistor 101 and a reference resistor 102 provides inputs to a comparator 105. The resistor bridge network is preferably a resistor bridge, thus further comprises two equal resistors 103 and 104. The output of the comparator is fed to a pulse feedback circuit 107. The pulse feedback circuit takes the comparator output to control feedback pulses to the resistor bridge network 100 for adjusting the resistance value of the matching resistor 101.

The reversible resistor trimming circuit first compares the matching resistor 101 to the reference resistor 102 through the comparator circuit 105. Then the comparator circuit 105 generates a comparing signal indicative of the difference between the reference resistor 102 and the matching resistor 101. The comparing signal then controls either the number of pulses, the polarity, the amplitude or the duration or any combinations of the electrical pulses provided by the pulse feedback circuit 107 to be applied to the matching resistor 101 to adjust its resistance value to match that of the reference resistor 102. The process is repeated until the resistance values of the matching resistor and the reference resistor are properly matched.

The matching resistor can be made from a metal-amorphous silicon-metal material or a perovskite material whose resistance is a function of the applied pulse polarity, amplitude, duration or the number of pulses. Since the direction of the resistance changes of the metal-amorphous silicon-metal material or a perovskite material depends on the polarity of the applied pulses, the feedback circuit provides the resistance adjustment pulses having the polarity dictated by the comparing signal. The pulse amplitude, the pulse duration and the number of pulses can also be controlled to improve the damping of the resistance oscillation.

The matching resistor can be made from a phase change material (such as a chalcogenide alloy with or without a transition metal). Since the direction of the resistance changes of the phase change material depends on the amplitude of the applied pulses, the feedback circuit provides the resistance adjustment pulses having the amplitude dictated by the comparing signal. The pulse duration and the number of pulses can also be controlled to improve the resistance oscillation.

The electrical pulses provided by the pulse feedback circuit is preferably voltage pulses, but can be current pulses. The duration of the electrical pulses is preferably between 10 fs and about 10 ms, and most preferably between 100 fs and 100 µs. The amplitude of the electrical pulses is preferably between 0.1 V and about 100 V. The number of pulses applied is preferably between 1 pulse and 1000 pulses.

Figure 4:
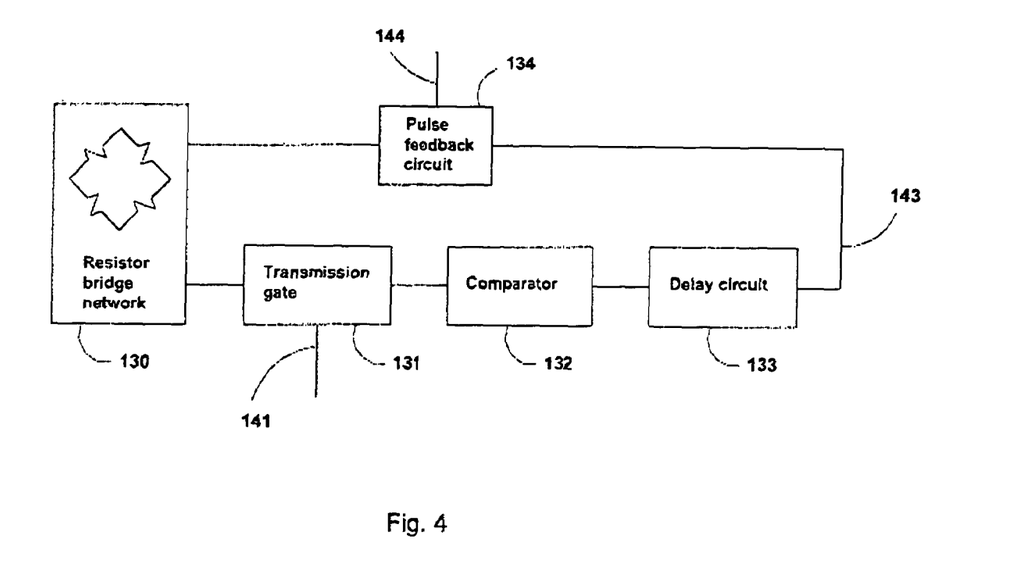
FIG. 4 shows the block diagram of another embodiment of the present invention reversible resistor trimming circuit.

FIG. 4 shows the block diagram of another embodiment of the present invention reversible resistor trimming circuit. The reversible resistor trimming circuit provides bipolar switching property, and comprises a resistance bridge 130, a transmission gate 131, a comparator circuit 132, a delay circuit 133, and a pulse feedback circuit 134.

The resistance bridge 130 comprises a matching resistor and a reference resistor, and preferably comprises two other equal resistors. The resistance bridge 130 is to provide the resistance values of the matching resistor and the reference resistor to the comparator circuit 132. A transmission gate 131 is provided between the resistance bridge 130 and the comparator circuit 132, preferably serving as an isolation between the resistance bridge 130 and the input of the comparator circuit 132. The transmission gate 131 further comprises a control signal 141 for controlling the transmission gate 131. When the gate control 141 closes, the transmission gate 131 is off and the resistance bridge 130 is isolated from the comparator circuit 132. The comparator circuit 132 is to compare the resistance values of the matching resistor and the reference resistor from the resistance bridge 130 and to generate a comparing signal indicative of the difference. The comparator circuit is preferably a differential amplifier for amplifying the difference in resistance values between the matching resistor and the reference resistor. The delay circuit 133 is optional and is preferably inserted to stabilize the feedback circuit. The delay circuit 133 can be omitted without causing serious effect on the resistor trimming capability of the system. The feedback circuit 134 is designed to take the comparing signal generated by the comparator and to provide an electrical pulse feed back to the resistance bridge to modify the resistance value of the matching resistor. The feedback circuit 134 is preferably a second transmission gate for isolating the feedback path between the resistance bridge 130 and the output of the comparator circuit 132. The transmission gate 134 further comprises a gate control 144 to control the transmission gate 134. When the gate control 144 closes, the transmission gate 134 is off and the resistance bridge 130 is isolated from the output of the comparator circuit 132.

The timing of the two transmission gates 131 and 134 is such that the resistance bridge is prevented from completing the loop. When the first transmission gate 131 is open, second transmission gate 134 is close and vice versa. The first transmission gate is pulsed open for the comparator circuit to compare the resistance values of the resistance bridge and to generate a comparing signal. The second transmission gate is pulsed open only during the close of the first transmission gate to propagate the comparison signal to the resistor bridge to modify the matching resistor.

Figure 5:
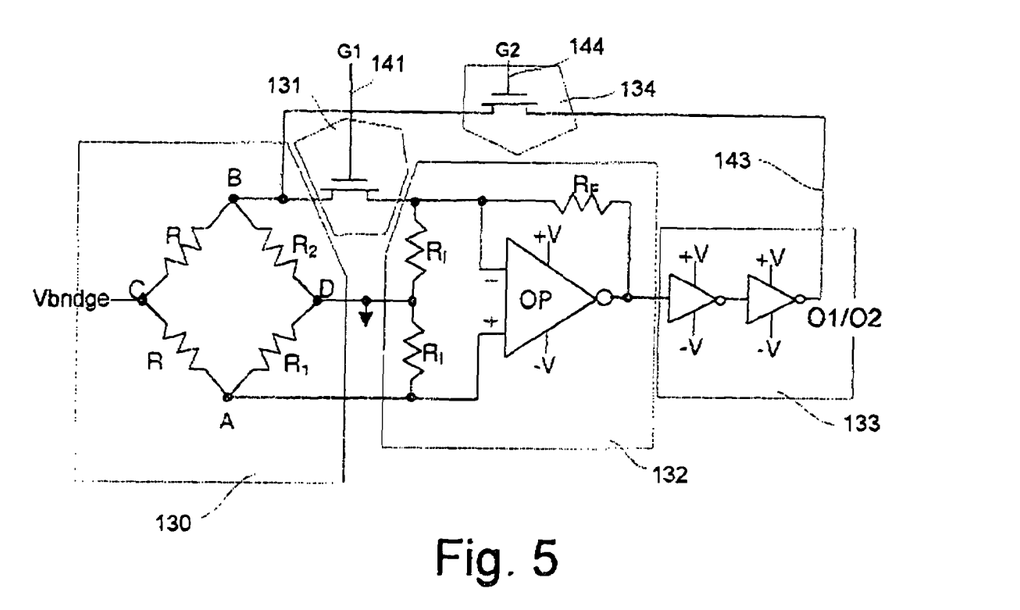
FIG. 5 shows an equivalent circuit of the block diagram in FIG. 4.

FIG. 5 shows an equivalent circuit of the block diagram in FIG. 4. The resistance bridge 130 comprises a matching resistor $R_2$ and a reference resistor $R_1$, together with two equal resistors R. The matching resistor $R_2$ is made of programmable resistance materials such as PCMO, or metal-amorphous silicon-metal material whose resistance value increases or decreases depending on the polarity of the applied pulses. A bias voltage Vbridge/ground is applied to two ends C and D of the resistance bridge, dividing the 4 resistors into 2 branches, each branch comprising one of the two equal resistors R. FIG. 5 shows the two equal resistors R connected to Vbridge in the resistance bridge, but these two equal resistors R can be connected to ground, providing that these two resistors are in different branches. This bias voltage Vbridge will generate two voltages VA and VB in nodes A and B of the resistance bridge. When these two voltages VA and VB are equal, the resistances of the matching resistor and the reference resistor are matched.

In the simplest formation, the transmission gate 131 comprises a single transistor. The transmission gate 131 can be any state-of-the-art transmission gate such as a parallel configuration of p- and n-channel transistors.

The comparator circuit 132 is preferably a differential amplifier. The differential amplifier shown in FIG. 5 comprises an operational amplifier with the bias resistors $R_F$ and $R_I$, together with the supplied voltages +V and -V. The comparator circuit 132 can be any state-of-the-art comparator circuit, which compares two values and outputs a signal depending on the difference of those values.

The delay circuit 133 shown in FIG. 5 comprises two inverters between the output of the comparator 132 and the input of the feedback circuit 134. The delay circuit 133 is inserted to stabilize the operational amplifier output waveform. The delay electronics may be omitted without causing serious effect on the operation of the resistor trimmer circuit.

The feedback circuit 134 is preferably a second transmission gate. Similar to the first transmission gate 131, the second transmission gate can be a single transistor.

Figure 6:
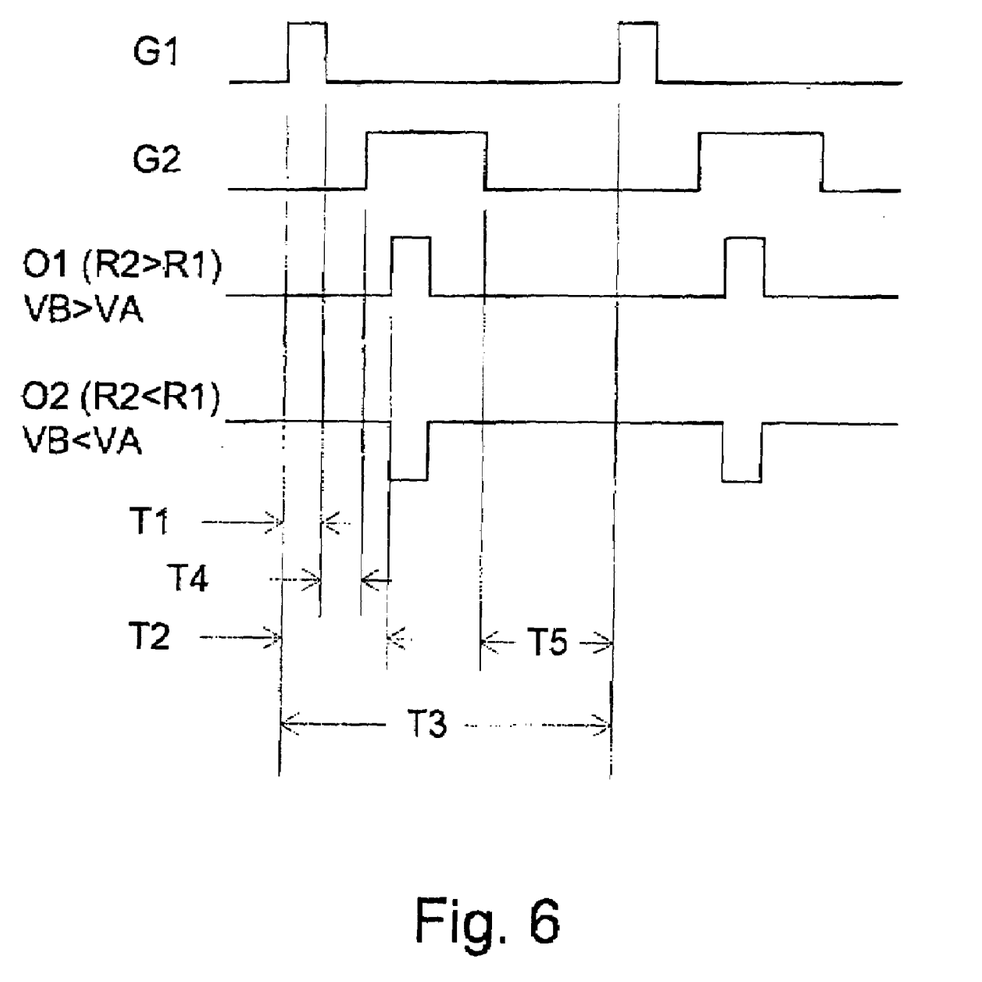
FIG. 6 shows the timing of the transmission gates.

The operation of the above resistor trimmer circuit preferably requires the timing of the gate functions. FIG. 6 shows the timing of the transmission gates. G1 is the waveform of the gate control 141 of the first transmission gate. G2 is the waveform of the gate control 144 of the second transmission gate. O1 and O2 are the waveforms of the output 143 of the delay circuit 133 for different values of the matching resistor $R_2$, when the resistance value of the matching resistor $R_2$ is higher than that of the reference resistor $R_1$ (signal O1), and when it is lower than the reference resistor (signal O2), respectively.

The first transmission gate 131 opens for a time T1 for the operational amplifier 132 to sense the bridge balance voltage. The time T1 for the first transmission gate open is preferably between 5 ns to 100 ns. The second transmission gate 134 opens after the first transmission gate 131 closes (T4>0, i.e. there is a delay time between the close of gate 131 and the opening of gate 134), and the second transmission gate 134 closes before the next opening of the first transmission gate 131 (T5>0, i.e. there is a delay time between the close of gate 134 and the next opening of gate 131). During the transmission gate 134 opening time, the signal propagates through the delay circuit 133 and feeds to the resistance bridge 130. The opening time of the second transmission gate 134 is preferably long enough so that the pulse duration feeding to the matching resistor $R_2$ is determined by T1, the pulse width of the first transmission gate 131 pulse. If the opening time of the second transmission gate 134 is not long enough, the pulse duration feeding to the matching resistor $R_2$ may be determined by the pulse width of the second transmission gate 134 pulse or minus any other timing delays. T2 is the delay time of the delay circuit 133, preferably larger than the combination of T1 and T4 (T2>T1+T4) to ensure that the generated pulse can propagate through the second transmission gate opening and not travel back to the first transmission gate.

When the resistance value of the matching resistor $R_2$ is larger than the resistance value of the reference resistor $R_1$, the voltage at point A is smaller than the voltage at point B (VB>VA). Therefore the output voltage pulse at point 143 is positive (shown as O1 in the timing of FIG. 6), and a narrow positive voltage pulse is applied to the matching resistor R2 during the opening of the second transmission gate 134. The matching resistor $R_2$ is configured so that a positive voltage pulse will reduce the resistance value of the matching resistor $R_2$. The position of the resistors in the resistance bridge, the polarities of the operational amplifier and the delay circuit, together with the configuration of the matching resistor $R_2$ are designed so that the feedback circuit is a negative feedback, meaning a higher resistance value of the matching resistor $R_2$ will receive a signal pulse to reduce the resistance, and vice versa.

If after the reduced pulse, the resistance value of the matching resistor $R_2$ is still larger than that of the reference resistor $R_1$, the voltage VB is still higher than the voltage VA, and the next pulse is still positive to further reduce the resistance value of the matching resistor R2.

When the resistance value of the matching resistor $R_2$ is smaller than the reference resistor R1, the voltage VA will be higher than the voltage VB (VA>VB), and the output voltage pulse at point 143 (shown as O2 in the timing of FIG. 6) is negative and the pulse applied to the matching resistor $R_2$ will act to increase the resistance of the matching resistor $R_2$.

The rate of increase or decrease of the matching resistor $R_2$ depends on the width and the amplitude of the trimming pulses. The width of the trimming pulses is controlled either by the pulse width T1 of the opening time of the first transmission gate 131, or by the pulse width of opening time of the second transmission gate 134, whichever is smaller. The amplitude of the trimming pulses is controlled by the power supply voltage of the delay circuit.

The precision of the resistance trimming is controlled by these two parameters, the pulse width and the pulse amplitude, together with the sensitivity of the amplifier. Higher precision trimming is obtained by narrower pulse width and lower pulse amplitude, but it will require longer trimming time, or larger number of trimming pulses. The initial resistance value of the matching resistor $R_2$ is not critical. It can be either larger or smaller than the resistance value of the reference resistor $R_1$.

While this invention has been described fully and completely, it should be understood that within the scope of the appended claims, the invention may be practiced otherwise than as specifically described. Although the invention has been disclosed with reference to its preferred embodiments, from reading this description those skilled in the art may appreciate changes and modifications that may be made which do not depart from the scope and spirit of the invention as described above and claimed hereafter.

What is claimed is:

1. A circuit for reversible trimming of a matching resistor to a reference resistor wherein a material of the matching resistor comprises a programmable resistance material, the circuit comprising
 a resistor bridge network comprising the reference resistor and the matching resistor;
 a comparator circuit in communication with the resistor bridge network for comparing the resistance values of the reference resistor and the matching resistor and for generating a comparing signal indicative of the difference between the reference resistor and the matching resistor; and
 a pulse feedback circuit coupled to the resistor bridge network, the feedback circuit coupled to the comparator circuit and providing a pulsed electrical signal to the matching resistor corresponding to the comparing signal.

2. A circuit as in claim 1 wherein the programmable resistance material is selected from the group of materials consisting of a metal-amorphous silicon-metal material, a phase change material and a thin film perovskite material.

3. A circuit as in claim 1 wherein the feedback circuit provides the pulsed electrical signal to modify the resistance of the matching resistor, the pulsed electrical signal having electrical characteristics taken from the group of electrical characteristics consisting of polarity, amplitude and duration, and any combination thereof, corresponding to the comparing signal from the comparator circuit.

4. A circuit as in claim 1 wherein the pulsed electrical signal has a duration of between 100 fs and about 1000 ns, and an amplitude of between 0.1 V and about 100 V.

5. A circuit for reversible trimming of a matching resistor to a reference resistor wherein a material of the matching resistor comprises a programmable resistance material, the circuit comprising
 a resistor bridge network comprising the reference resistor and the matching resistor;
 a comparator circuit in communication with the resistor bridge network for comparing the resistance values of the reference resistor and the matching resistor and for generating a comparing signal indicative of the difference between the reference resistor and the matching resistor; and a first transmission gate coupled between the resistor bridge network and the input of the comparator circuit;
 a pulse feedback circuit coupled to the resistor bridge network, the feedback circuit coupled to the comparator circuit and comprising a second transmission gate;
 wherein the first and second transmission gates are controlled such that the first transmission gate is pulsed open for the comparator circuit to compare the resistance values of the resistor bridge network and to generate the comparing signal and the second transmission gate is pulsed open after the close of the first transmission gate to propagate the comparing signal to the resistor bridge network.

6. A circuit as in claim 5 wherein the resistor bridge network includes two resistors with equal resistance, and wherein the matching resistor is a pulse adjustable resistor.

7. A circuit as in claim 5 wherein the comparator circuit is a differential amplifier.

8. A circuit as in claim 5 wherein each of the transmission gates consists of a single transistor.

9. A circuit as in claim 5 further comprising a delay circuit between the output of the comparator circuit and an input of the pulse feedback circuit.

10. A circuit as in claim 5 wherein a pulsed signal to pulse open the first transmission gate has a duration of between 5 ns to 100 ns.

11. A circuit as in claim 5 wherein a pulsed signal to pulse open the first transmission gate has an amplitude of between 0.1 V and about 100 V.

12. A circuit as in claim 5 wherein the programmable resistance material is selected from the group of materials consisting of a metal-amorphous silicon-metal material, a phase change material and a thin film perovskite material.

13. A circuit as in claim 12 wherein the metal-amorphous silicon-metal material comprises boron doped amorphous silicon layer located between two electrodes, one electrode being Cr and the other being V, Co, Ni, Pd, Fe or Mn.

14. A circuit as in claim 12 wherein the phase change material comprises at least one chalcogen and one or more transition metals.

15. A circuit as in claim 12 wherein the thin film perovskite material is selected from a group of materials consisting of colossal magnetoresistive materials and high temperature superconducting materials.

16. A circuit as in claim 12 wherein the thin film perovskite material is selected from a group consisting of PrCaMnO (PCMO), LaCaMnO (LCMO), LaSrMnO (LSMO), LaBaMnO (LBMO), LaPbMnO (LPMO), NdCaMnO (NCMO), NdSrMnO (NSMO), NdPbMnO (NPMO), and LaPrCaMnO (LPCMO), GdBaCoO (GBCO) and mixtures and combinations thereof.

17. A method of reversible trimming of a matching resistor to a reference resistor wherein a material of the matching resistor comprises a programmable resistance material, the method comprising
 comparing the matching resistor to the reference resistor;
 generating a comparing signal indicative of the difference between the reference resistor and the matching resistor;
 applying a pulsed electrical signal to the matching resistor, the pulsed electrical signal corresponding to the comparing signal.

18. A method as in claim 17 further comprising the repetition of the above steps until the resistances of the matching resistor and the reference resistor are matched.

19. The method of claim 17 wherein the programmable resistance material is selected from the group of material consisting of a metal-amorphous silicon-metal material, a phase change material and a thin film perovskite material.

20. A circuit as in claim 17 wherein a feedback circuit provides the pulsed electrical signal to modify the resistance of the matching resistor, the pulsed electrical signal having electrical characteristics taken from the group of electrical characteristics consisting of polarity, amplitude and duration, and any combination thereof, corresponding to the comparing signal from the comparator circuit.

* * * * *